US012564096B2

(12) United States Patent
Ye et al.

(10) Patent No.: US 12,564,096 B2
(45) Date of Patent: Feb. 24, 2026

(54) NESTED SEMICONDUCTOR ASSEMBLIES AND METHODS FOR MAKING THE SAME

(71) Applicant: Micron Technology, Inc., Boise, ID (US)

(72) Inventors: Seng Kim Ye, Singapore (SG); Kelvin Tan Aik Boo, Singapore (SG); Hong Wan Ng, Singapore (SG); Chin Hui Chong, Singapore (SG)

(73) Assignee: Micron Technology, Inc., Bosie (ID)

( * ) Notice: Subject to any disclaimer, the term of this patent is extended or adjusted under 35 U.S.C. 154(b) by 590 days.

(21) Appl. No.: 17/879,660

(22) Filed: Aug. 2, 2022

(65) Prior Publication Data

US 2024/0047423 A1 Feb. 8, 2024

(51) Int. Cl.
H01L 25/065 (2023.01)
H01L 21/304 (2006.01)
H01L 23/00 (2006.01)

(52) U.S. Cl.
CPC ...... H01L 25/0657 (2013.01); H01L 21/3043 (2013.01); H01L 24/16 (2013.01); H01L 24/48 (2013.01); H01L 2224/16221 (2013.01); H01L 2224/48147 (2013.01); H01L 2224/48149 (2013.01); H01L 2224/48221 (2013.01); H01L 2225/06506 (2013.01); H01L 2225/0651 (2013.01); H01L 2225/06517 (2013.01); H01L 2225/06562 (2013.01); H01L 2924/1011 (2013.01); H01L 2924/10158 (2013.01); H01L 2924/1431 (2013.01); H01L 2924/1436 (2013.01); H01L 2924/1438 (2013.01); H01L 2924/1815 (2013.01); H01L 2924/182 (2013.01)

(58) Field of Classification Search
CPC . H01L 25/0657; H01L 21/3043; H01L 24/16; H01L 24/48; H01L 2224/16221; H01L 2224/48147; H01L 2224/48149; H01L 2224/48221; H01L 2225/06506; H01L 2225/0651; H01L 2225/06517; H01L 2225/06562; H01L 2924/1011; H01L 2924/10158; H01L 2924/1431; H01L 2924/1436; H01L 2924/1438; H01L 2924/1815; H01L 2924/182; H01L 25/18; H01L 2225/06541
See application file for complete search history.

(56) References Cited

U.S. PATENT DOCUMENTS

| | | | | |
|---|---|---|---|---|
| 2004/0000723 | A1* | 1/2004 | Egawa | H01L 23/3128 |
| | | | | 257/E29.022 |
| 2005/0194673 | A1* | 9/2005 | Kwon | H01L 24/49 |
| | | | | 257/E29.022 |
| 2006/0292745 | A1* | 12/2006 | Tan | H01L 23/3128 |
| | | | | 257/E29.022 |
| 2009/0321950 | A1* | 12/2009 | Takiar | H01L 25/0657 |
| | | | | 257/E23.024 |

(Continued)

*Primary Examiner* — William B Partridge
*Assistant Examiner* — Erik A. Anderson
(74) *Attorney, Agent, or Firm* — Dorsey & Whitney LLP

(57) ABSTRACT

A semiconductor device assembly is provided. The assembly includes an outer semiconductor device which has an active surface and a back surface. The back surface includes a cut that extends to a depth between the active surface and the back surface, and uncut regions on opposing sides of the cut. The assembly further includes an inner semiconductor device disposed within the cut of the outer semiconductor device.

19 Claims, 11 Drawing Sheets

(56)          References Cited

U.S. PATENT DOCUMENTS

| | | | |
|---|---|---|---|
| 2014/0054796 A1* | 2/2014 | Gong | H01L 24/82 |
| | | | 438/669 |
| 2019/0229057 A1* | 7/2019 | Cheah | H01L 23/48 |
| 2019/0287945 A1* | 9/2019 | Tojo | H01L 25/0657 |
| 2024/0014144 A1* | 1/2024 | Kim | H01L 23/544 |

* cited by examiner

100

112

113

105

104

108  109  107  108  106

102

101

103

200

207

204

206

208  209  208

300

304

400

404

700

772b

706

<u>708</u>

800

872a

806

<u>808</u>

900

1000

1100

1173b

1172c

1108

1108

1108

1106

1108

1700

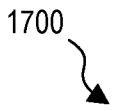

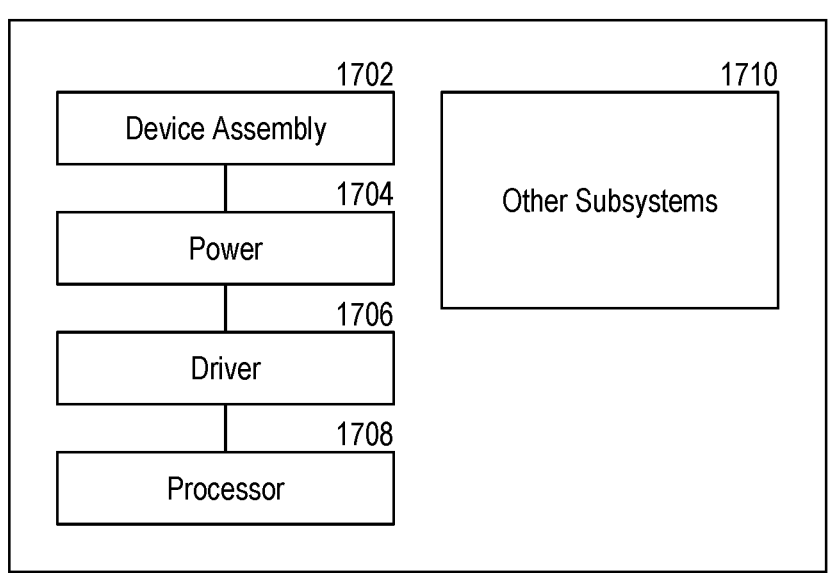

1702

Device Assembly

1710

Other Subsystems

1704

Power

1706

Driver

1708

Processor

FIG. 17

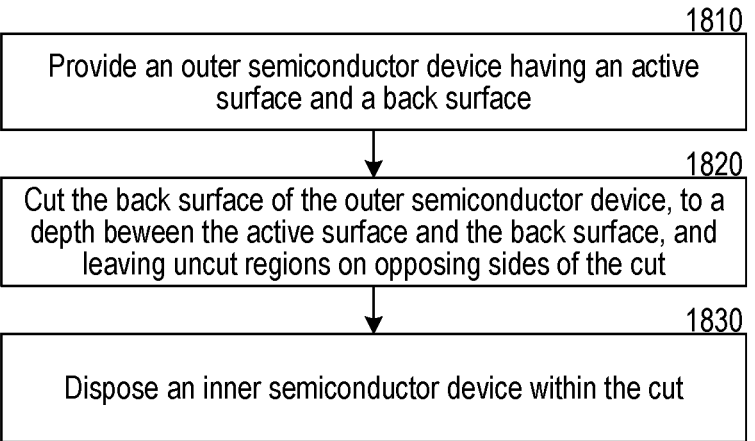

1810

Provide an outer semiconductor device having an active surface and a back surface

1820

Cut the back surface of the outer semiconductor device, to a depth beween the active surface and the back surface, and leaving uncut regions on opposing sides of the cut

1830

Dispose an inner semiconductor device within the cut

FIG. 18

NESTED SEMICONDUCTOR ASSEMBLIES AND METHODS FOR MAKING THE SAME

TECHNICAL FIELD

The present disclosure generally relates to semiconductor device assemblies, and more particularly relates to nested semiconductor assemblies and methods for making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 17 is a schematic view showing a system that includes a semiconductor device assembly configured in accordance with an embodiment of the present technology.

FIG. 18 is a flow chart illustrating a method of making a semiconductor device assembly in accordance with an embodiment of the present technology.

DETAILED DESCRIPTION

The electronics industry relies upon continuous innovation in the field of semiconductor packaging to meet the global need for higher-functioning technology. This demand calls for increasingly complicated assemblies of semiconductor devices, which may diverge in terms of plan area, thickness, connection methodology, etc. One approach to accommodate the packaging of such varied devices into a single assembly is to stack larger semiconductor devices over a smaller one. To achieve this stack, one or more spacers may be used (e.g., structures that can provide mechanical support to carry other devices, but which generally do not include circuitry). One method of employing spacers is to dispose them adjacent to the smaller device in order to support the larger devices above.

For example, a stack of larger devices can be supported by spacers over a device that is mounted directly to a package substrate. This mounted device can not only be smaller than the devices in the stack, but also shorter than the supporting spacers positioned on opposing sides of itself, so that the stack of larger devices can form a "bridge" over the smaller device. Spacers, however, have many disadvantages. They are not only costly, but also difficult to add to an assembly. For example, these spacers must be formed separately, are bespoke to the specific requirements of the assembly, present a challenge to ensure their coplanarity with the surrounding semiconductor devices, pose a risk of cracking, etc.

Embodiments of the present disclosure solve those challenges and others by providing special nested semiconductor device assemblies. These include a device with a cavity that can hold another, smaller semiconductor device within it. This cavity can be formed by removing or cutting a portion from the back (i.e., non-active) side of the larger device, which can provide sufficient depth to accommodate the smaller device, and which does not disturb circuitry at the larger device's active side. By virtue of its design, this solution is not only easier and less expensive to manufacture than an assembly with spacer, but it is also inherently co-planar to the rest of the assembly.

Figure 1:
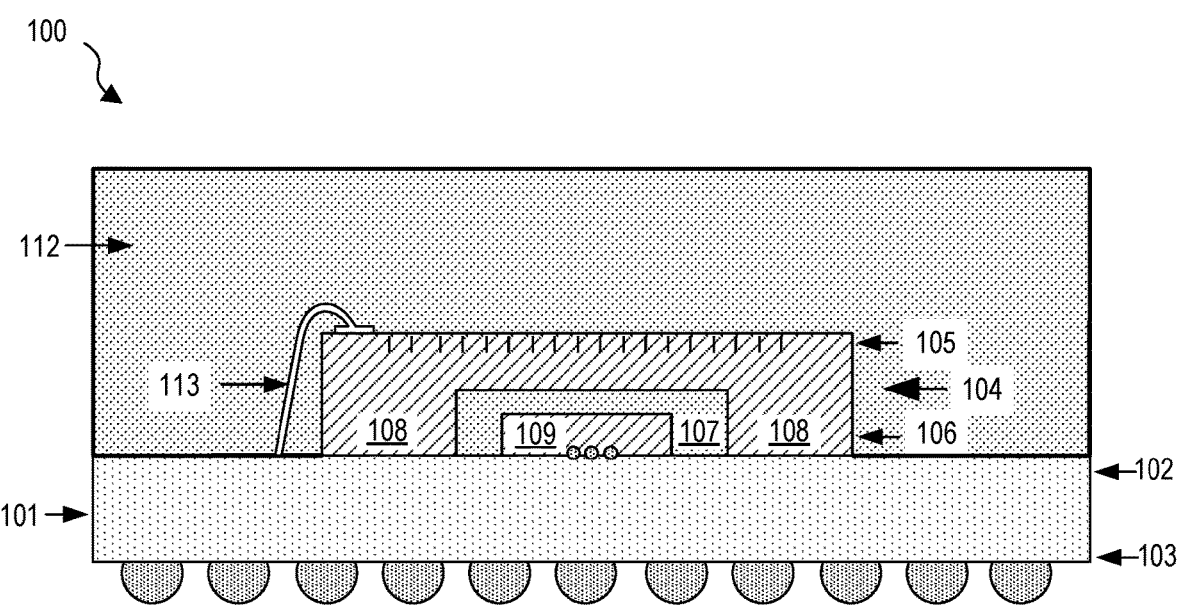
FIG. 1 is a simplified schematic cross-sectional view of a semiconductor device assembly in accordance with embodiments of the present technology.

FIG. 1 is a simplified cross-sectional schematic view of a semiconductor device assembly 100 in accordance with embodiments of the present technology. As can be seen with reference to FIG. 1, the assembly 100 can include an outer semiconductor device 104 (alternatively labeled 404, 504, 604, or 1504) which has an active surface 105 (e.g., in which semiconductor device circuitry is formed) and a back surface 106 (alternatively labeled 306, 506, 906, 1206, 1406, or 1506). The back surface 106 can include a cut 107 (alternatively labeled 1407, or 1507) and uncut regions 108 (alternatively labeled 308, 408, 508, 608, 708, 808, 908, 1008, 1108, 1208, 1508, 1608, or 1698). An inner semiconductor device 109 can be disposed within the cut 107. Both the inner semiconductor device 109 and the uncut regions 108 can attach to the upper surface 102 of a substrate 101. As shown in FIG. 1, the outer device 104 can be disposed toward the center of the substrate 101, although the outer device 104 can also be biased to one side of the substrate 101, leaving space on the upper surface 102 of the substrate 101 for other devices to connect that are not illustrated (e.g., a passive surface-mount capacitor, a resistor, a transistor, an inductor, a transformer, a diode, a sensor, etc.). Also, the inner semiconductor device 109 can be attached in a flip-chip arrangement by interconnects between pads on its active (e.g., lower) surface and pads on the upper surface 102 of the substrate 101. As seen in FIG. 1, the inner semiconductor device 109 can be shorter than the depth of the cut 107. In alternative embodiments, the inner device 109 can be just as tall as the cut 107 so that the inner device 109 is in contact with the outer device 104. Additionally, FIG. 1 the inner device 109 can be less wide than the cut 107. This gap can be larger or smaller, or almost completely eliminated (e.g., depending upon the alignment accuracy of the tool attaching the outer device 104). As illustrated in FIG. 1, the inner device 109 can be disposed somewhat near the center of the cut 107. In other embodiments, the inner device 109 can be disposed closer to one of the uncut regions 108. Although not illustrated in FIG. 1, the cut 107 can also be filled with some other material (e.g., encapsulant, electrically non-conducting, thermally conductive, etc.). FIG. 1 shows the inner device 109 can be a chip, although it can be a different type of component (e.g., a passive surface-mount capacitor, a resistor, a transistor, an inductor, a transformer, a diode, a sensor, etc.). The outer semiconductor device 104 can be attached in a wire-bonded arrangement by wirebonds 113 (alternatively labeled 1413 and 1513) between pads on its active (e.g., upper) surface 105 (alternatively labeled 305, 405, 505, 605, or 1505) and pads on the upper surface 102 of the substrate 101. Alternatively, the outer device 104 can be electrically connected to the substrate 101 by other means (e.g., by a corresponding plurality of back-side interconnect structures coupled to the active surface by through-silicon vias, such as solder balls, copper pillars, copper bumps, etc.). The substrate 101 can also have a lower surface 103 (alternatively labeled 1403, or 1503) with a plurality of external contact pads for connecting the assembly 100 to higher-level devices, coupled to the semiconductor devices of the assembly by traces, vias, and other conductive structures of the substrate 101 (not shown). The assembly 100 can also include an encapsulant material 112 encapsulating the upper surface 102 of the substrate 101, the outer semiconductor device 104, and the wirebonds 113.

Figure 2:
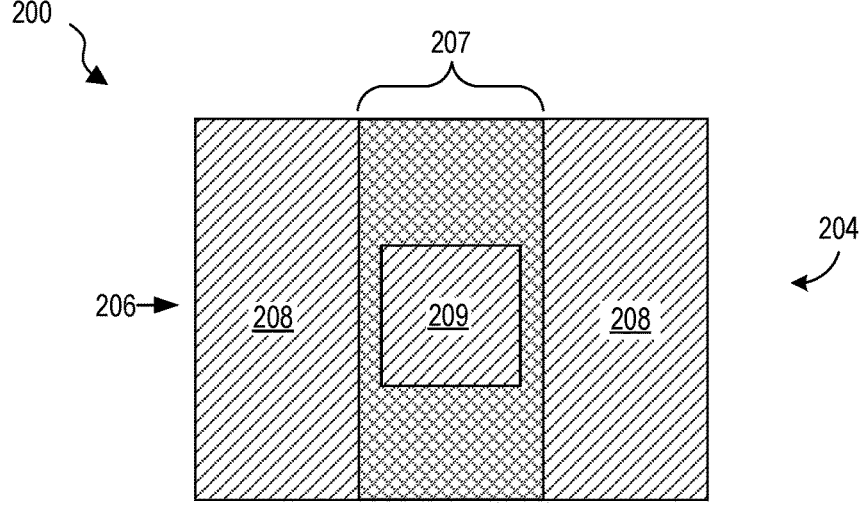
FIG. 2 is a simplified schematic plan view of a semiconductor device assembly in accordance with embodiments of the present technology.

Illustrating another perspective of the technology, FIG. 2 portrays a simplified cross-sectional schematic view of a semiconductor device assembly 200 possessing a cut 207 in a back surface 206 of the outer semiconductor device 204 and two opposing uncut regions 208 on either side of its cut 207, such that these uncut regions 208 can form a level base of support for additional devices in the assembly 200 when positioned on top of another semiconductor device, substrate, electrical component, etc. This view shows an inner semiconductor device 209 can be disposed in the cut 207, and also shows how the uncut regions 208 can support the outer semiconductor device 204 over the inner semiconductor device 209 without any of the potential non-coplanarity associated with the use of multiple discrete spacers. FIG. 2 shows a single chip 209 inside the cut 207, as do the other Figures, although a single cut can have multiple chips, devices, and/or components disposed within it. Moreover, a full-width cut (e.g., extending between opposing sidewalls) can be easily formed in multiple semiconductor devices aligned in columns and rows in a semiconductor device wafer, as set forth in greater detail below with reference to FIG. 13. As illustrated in FIG. 2, the cut 207 can be in the center of the back surface 206, although it may also be positioned off-center. Additionally, the cut 207 can run in a straight line as illustrated, or in a curved line across the back surface 206.

Figure 3:
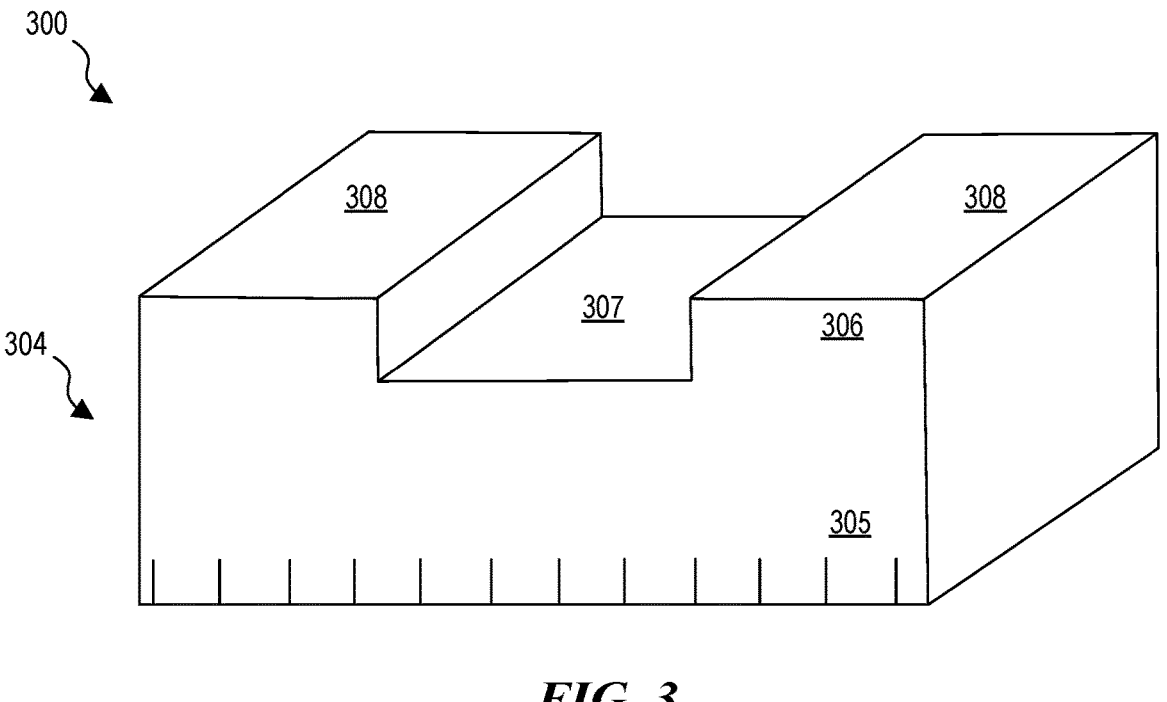
FIGS. 3-6 are simplified schematic oblique views of a semiconductor device in accordance with embodiments of the present technology.
Figure 4:
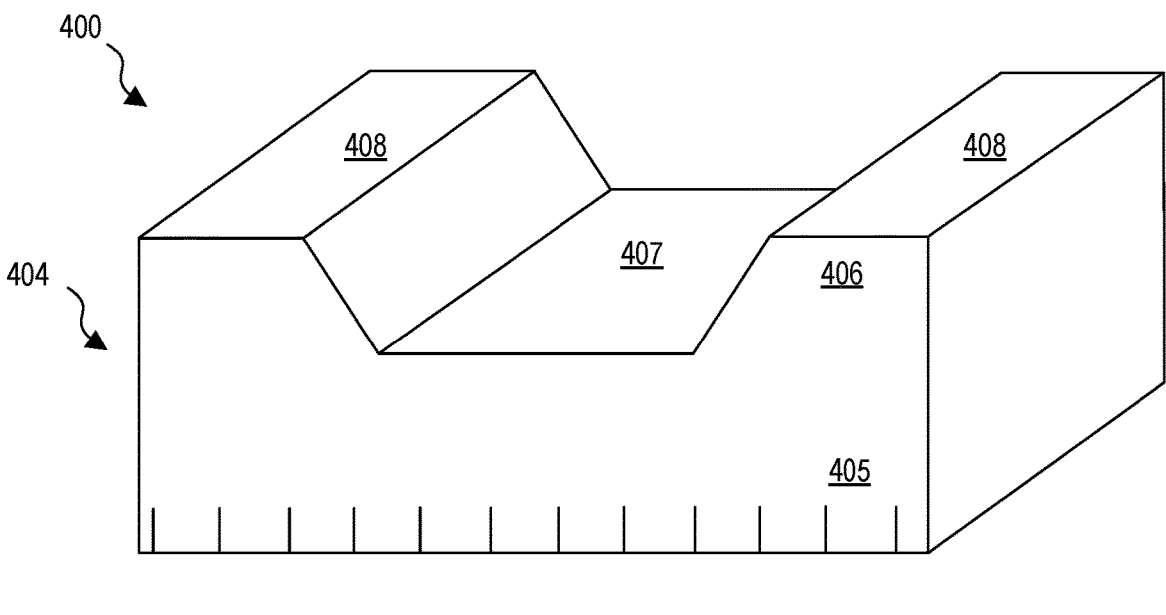

As seen in FIG. 3, which depicts a perspective view of an outer semiconductor device 300 in accordance with one embodiment of the present disclosure, a full width cut 307 may have vertical sidewalls. Additionally, these sidewalls may have a smooth texture as illustrated, or they may be rough and coarse, depending on the method for making the cut. Alternatively, as see in FIG. 4, which shows a perspective view of an outer semiconductor device 400 in accordance with another embodiment of the present disclosure, a cut 407 may have sidewalls that form a non-right angle (e.g., oblique or acute) with respect to a back surface 406 of the device 400. As illustrated, these angles may be equal (when measuring the angle of the cut 407), although in other embodiments the angles can differ (e.g., one sidewall can form an acute angle while the other forms an oblique angle, a different acute angle, or a right angle, etc.).

Figure 5:
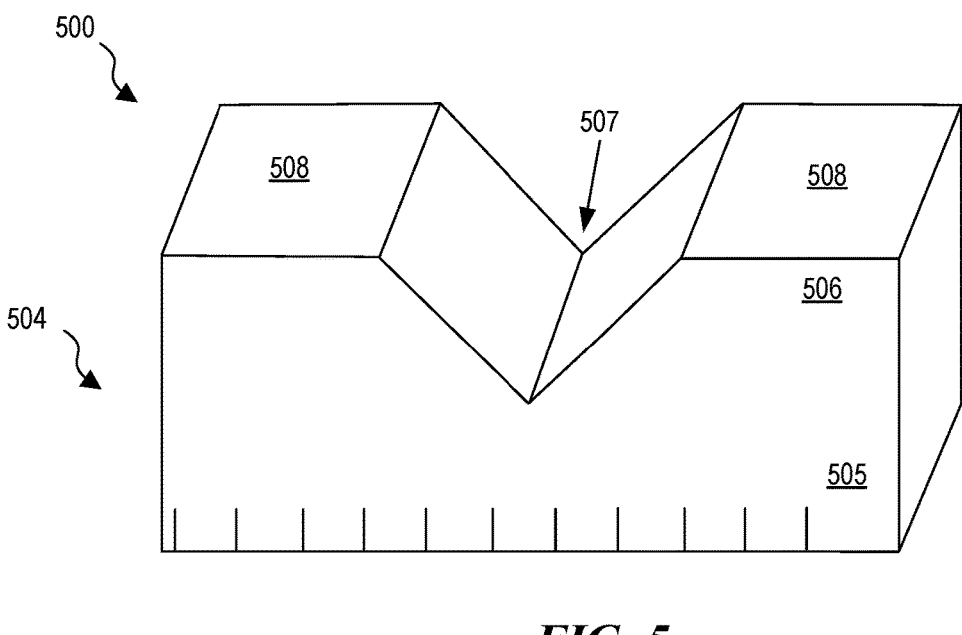

Although the foregoing examples have been illustrated and described with reference to cuts defined by quadrilateral cross-sectional shapes, in other embodiments a cut can have some other polygonal cross-sectional shape. For example, FIG. 5 shows a perspective view of a cut 507 in accordance with another embodiment of the present disclosure in which a triangular cut is provided in the back surface of a semiconductor device 500. Although the cut 507 is illustrated as forming a triangle, in other embodiments a cut can be formed with any polygonal cross-sectional shape, with any number of sidewalls at any angle. Such a cut 507 may be desired when configured to contain a very small device or a passive circuit element (e.g., a surface-mount capacitor, etc.).

Figure 6:
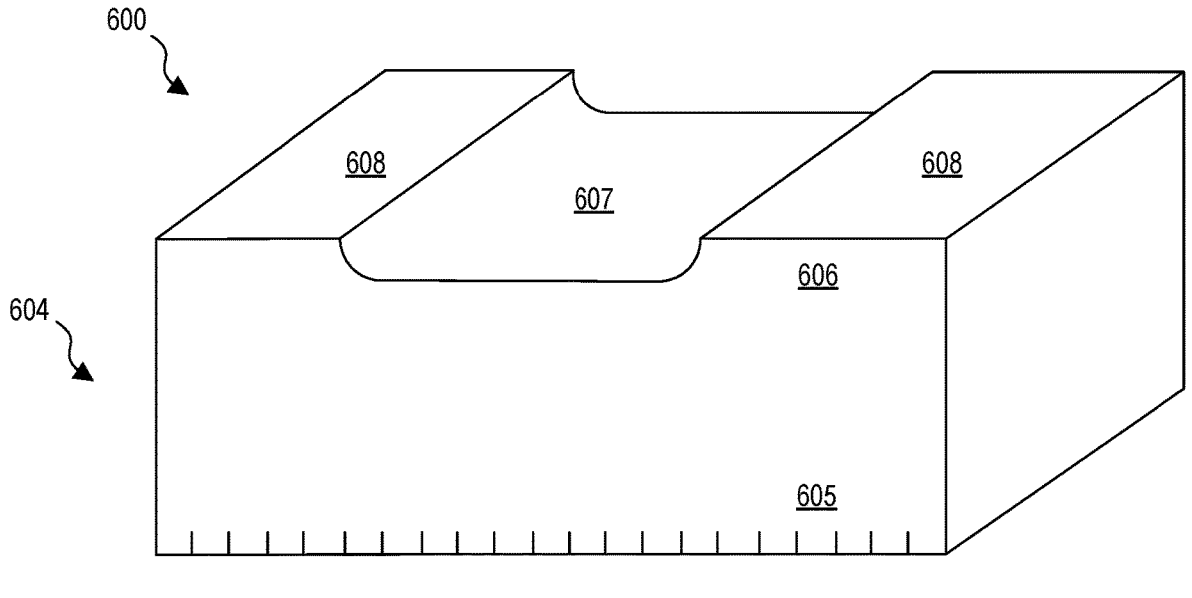

In accordance with yet another embodiment of the present disclosure, the shape defined by a cut can be curvilinear, rather than polygonal. For example, FIG. 6 shows a cut 607 formed with rounded corners between the sidewalls and recessed surface thereof. Such a cut can be provided with a non-polygonal shape as a result of the method of forming the same (e.g., from etching). The non-polygonal cut can be semi-circular, semi-elliptical, semi-ovoid, or represent an arc of any degree of any one of the previously mentioned shapes.

Figure 7:
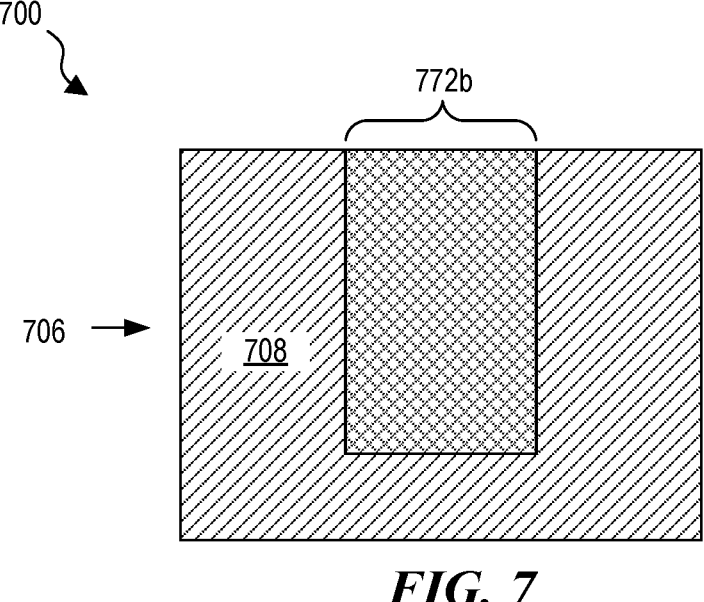
FIGS. 7-12 are simplified schematic plan views of a semiconductor device in accordance with embodiments of the present technology.
Figure 8:
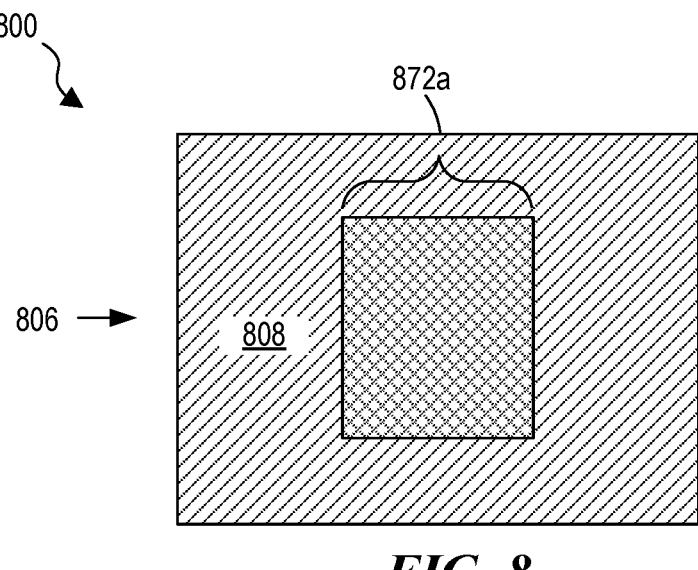

As illustrated in the foregoing Figures, the cut 607 provided in a back side 606 of an outer semiconductor device 600 can be a channel extending across the full width of the outer semiconductor device 600. FIG. 7, however, illustrates a case in which a cut 772a does not reach both sides of a back surface 706 a device 700 in accordance with another embodiment of the present disclosure. Additionally, as shown by FIG. 8, a cut 872a does not have to reach any sides of a back surface 806 of a device 800, and can be formed as an internal cavity (e.g., by dry or wet etching). Corners of the cuts 772a and 872a can be square, as depicted in the Figures, or they can be curved, to any degree, such that the cut 872a of device 800 can form a circle. Additionally, the shape of the cuts 772a and 872a as they are formed on the back surfaces 706 and 806 of the devices 700 and 800 can also be represented by any regular or irregular polygonal shape. As illustrated, these cuts 772a and 872a can be in the center of the back surface, although they can be closer to one side. Additionally, cut 772a can extend past the midpoint of the back surface 706, as illustrated in FIG. 7, or it can be shorter than the midpoint.

Figure 9:
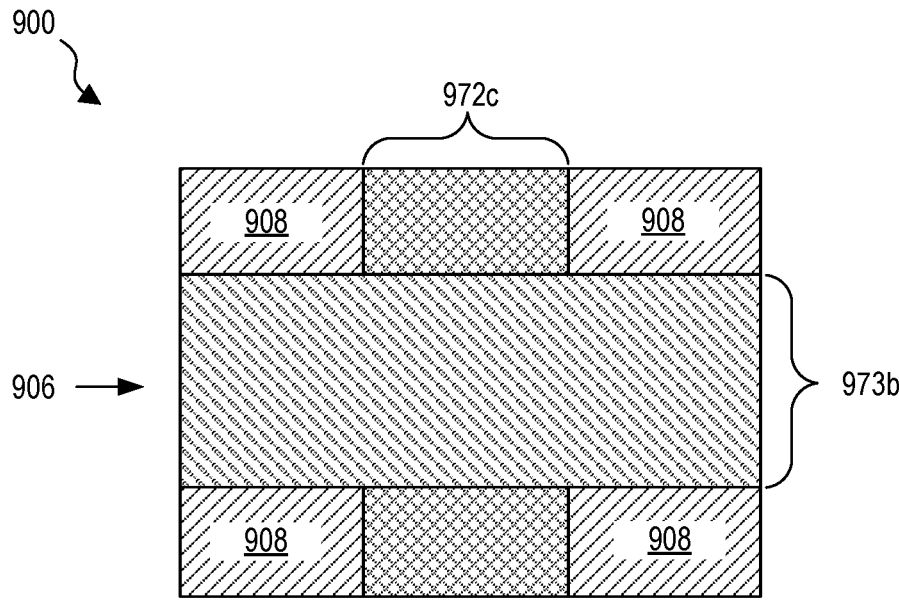

In the foregoing example embodiments, outer semiconductor device have been illustrated and described with a back surface including only a single cut. In other embodiments, however, more than one cut may be provided, as illustrated in the example embodiment of FIG. 9. FIG. 9 shows a second cut 973a crossing a first cut 972c at a right angle, although these cuts can intersect at any angle. Such an arrangement may be beneficial when multiple devices are disposed under the outer semiconductor device 900.

Figure 10:
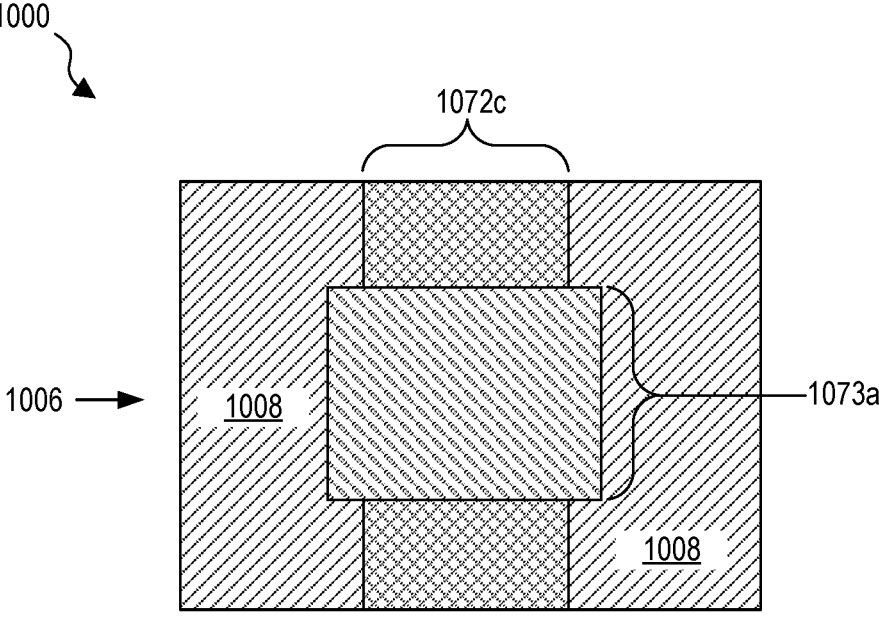

Moving to an alternate embodiment, FIGS. 10 illustrates that a first cut 1072c or a second cut 1073a does not need to reach the edges of a back surface 1006 of a device 1000. These cuts 1072c and 1073a may have round or square corners and they may form any regular or irregular polygonal shape. As another potential example, FIG. 11 reveals an alternate aspect in which a first cut 1172c and a second cut 1173a do not need to be perpendicular to the edges of a back surface 1106 of a device 1100. Although the foregoing illustrated embodiments of the semiconductor device 1100 show a quadrilateral, the semiconductor device 1100—and all of the semiconductor devices of the foregoing and proceeding embodiments, either illustrated or described, delimited or comprised in a larger structure—can have any number of sides, or can form a circular or ovoid shape. Additionally, the cuts 1172c and 1173a can begin and end on opposite corners of the back surface 1106, or they can begin and end on corners that are not opposing, of whatever shape the device 1100 possesses. Another possible embodiment is that only one cut 1172c can begin and end on corners while the other cut 1173a begins on a corner while ending on a side, or both cuts 1172c and 1173a both begin on a corner and end on a side, or neither cut 1172c and 1173a either begin or end on a corner.

Figure 12:
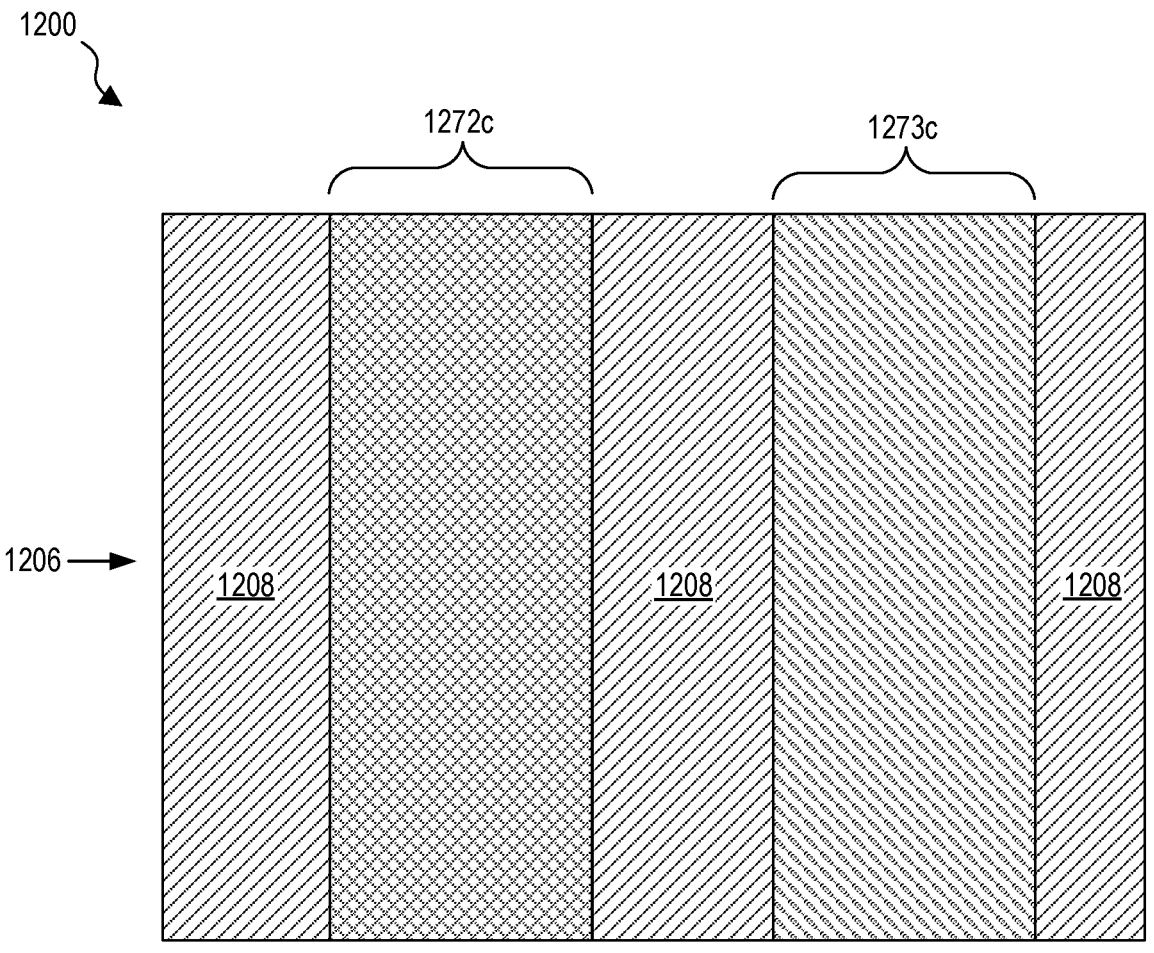

Evolving this concept, FIG. 12 portrays an example in which a device 1200 can have a first cut 1272c and a second cut 1273c that do not intersect. These cuts 1272c and 1273c can also be parallel. The width of these cuts 1272c and 1273c are shown to be equal; however, one cut can be wider than the other cut. Additionally, in any of the foregoing embodiments, illustrated or described, either explicitly or implicitly, the narrower cut can be made within the region of the wider cut, thereby creating a cut with varying tiers. This tiered cut can have a step shape. The sides of the steps made by the cut in the cut can have vertical sides, angled sides, or curved sides. The deeper cut can run down the middle of the shallower cut, or closer to one side, or may angle across the shallower cut, or may curve in a serpentine manner down the length of the shallower cut.

The semiconductor device illustrated by the foregoing Figures may have more than one inner semiconductor device disposed within its cuts, at any point of intersection between cuts, or anywhere along the length of any cut made in its back surface, etc.

Figure 11:
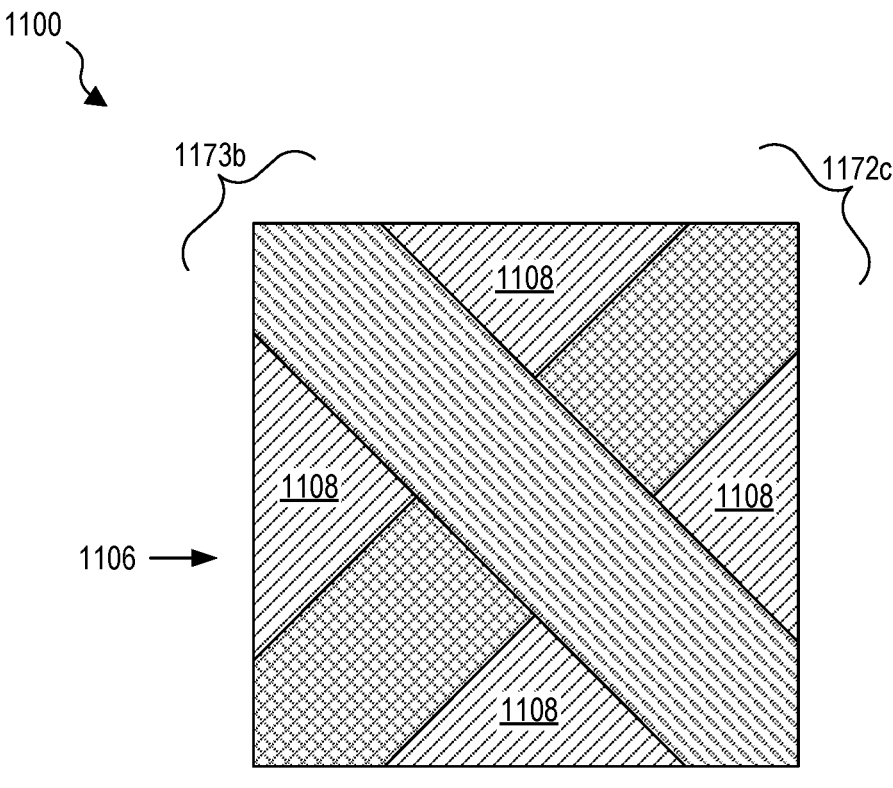
Figure 13:
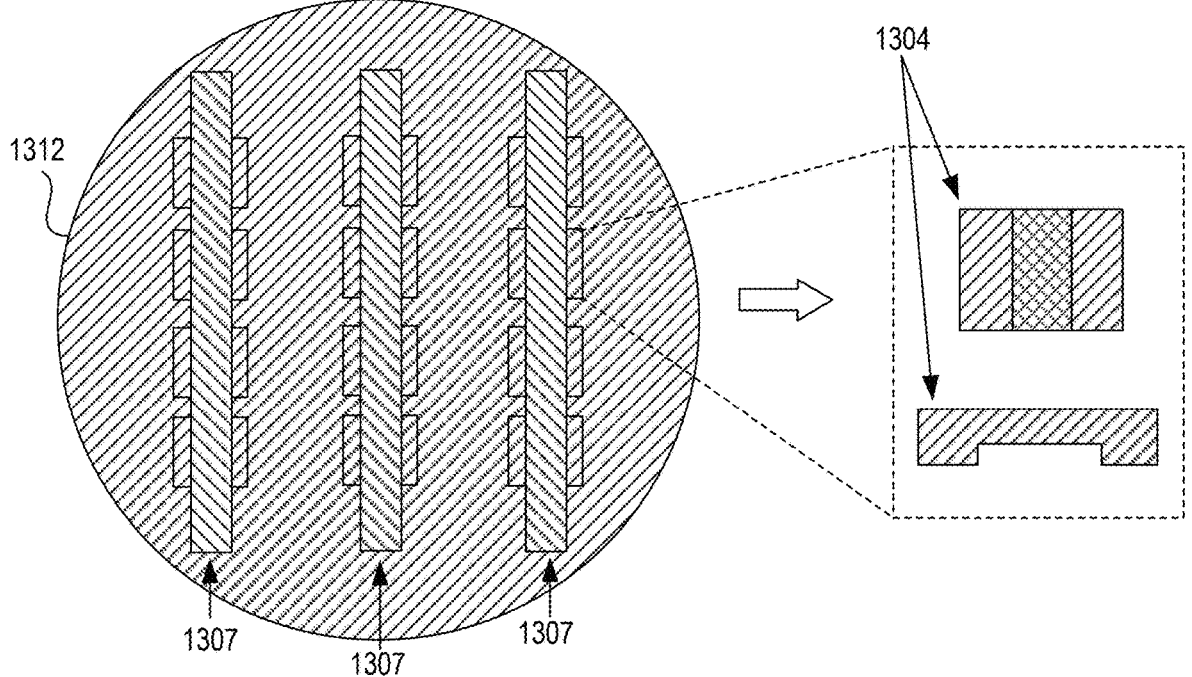
FIG. 13 is a simplified schematic detail view illustrating a series of fabrication steps of semiconductor device assemblies in accordance with an embodiment of the present technology.

From the foregoing Figures, the semiconductor devices can also be dies that have been singulated from a semiconductor wafer, as may be more readily appreciated with reference to FIG. 13. FIG. 13 is a simplified schematic cross-sectional view illustrating a method of fabricating a plurality of semiconductor devices 1304 in accordance with an embodiment of the present technology. As can be seen with reference to FIG. 13, a single cut 1307 (e.g., formed by sawing, laser ablation, directional etching, masked wet etching, etc.) can be formed across the back surface of a plurality of semiconductor devices 1304 arranged in a row or column in a wafer 1312. In this way, multiple semiconductor devices 1304 can be provided with back-side cuts 1307 simultaneously prior to their singulation. The cut semiconductor devices 1304 can come from some structure other than a wafer (e.g., panels, strips, etc.), or the devices can be cut individually. The cuts 1307 are illustrated as straight parallel lines that do not run the full length of the wafer, although in other embodiments they may be curved, intersect with one another, run the full width and/or length of the wafer 1312, etc. Additionally, other series of cuts may be made that overlay the original series of cuts 1307 to form alternate patterns on the singulated semiconductor devices 1304, such as a cross-hatch, as seen in FIG. 9, or an X-shape, as seen in FIG. 11, or any of the other patterns either illustrated or described in this application, explicitly or implicitly.

Figure 14:
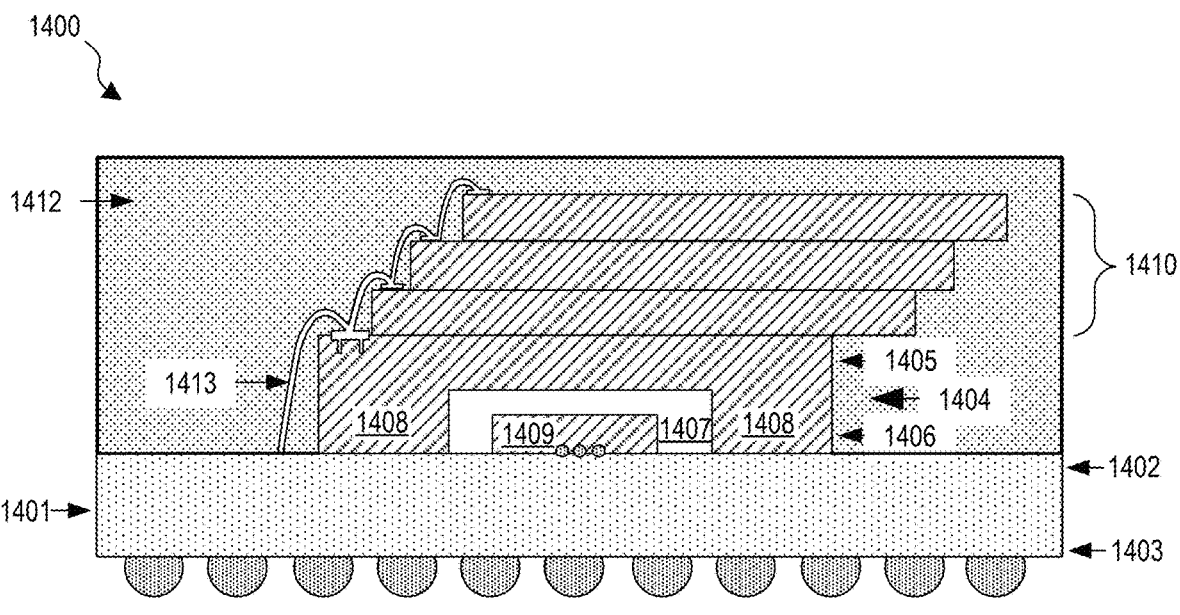
FIGS. 14-15 are simplified schematic cross-sectional views of a semiconductor device assembly in accordance with embodiments of the present technology.

As represented in FIG. 14, the semiconductor device assembly 1400 may possess a stack of semiconductor devices 1410 disposed atop a lower semiconductor device 1404, each attached in a wire-bonded arrangement by wirebonds 1413 between pads on their active (e.g., upper) surfaces 1405 and pads on the upper surface 1402 of the substrate 1401. Because of the robust support provided to the lower semiconductor device 1404 by the uncut regions 1408 thereof, the stacking and bonding operations that connect the additional semiconductor devices 1410 can be performed without worry of cracking or damage that can occur when such operations are performed over a device balanced on non-coplanar spacers or other structures. Although illustrated as a single stack of devices 1410, this stack 1410 can also take the embodiment of multiple stacks of devices 1410 disposed atop the active surface 1405 of a lower semiconductor device 1404. As it is currently illustrated, the stack 1410 can be a shingled stack, or may alternatively be a vertical stack of TSV-enabled dies. Additionally, the stack 1410 could be a horizontal stack. Each device in the stack 1410 could have a cut in its back surface containing an inner semiconductor device. These inner semiconductor devices could be connected to the surface 1402 of the substrate 1401. The inner semiconductor device 1409 can be attached in a flip-chip arrangement by interconnects between pads on its active (e.g., lower) surface and pads on the upper surface 1402 of the substrate 1401. The assembly 1400 can also include an encapsulant material 1412 encapsulating the upper surface 1402 of the substrate 1401, the outer semiconductor device 1404, and the wirebonds 1413. As illustrated, the encapsulant material 1412 encompasses the semiconductor device stack 1410, although the height of the stack 1410 can be nearly the same as the height of the encapsulant material 1412.

Figure 15:
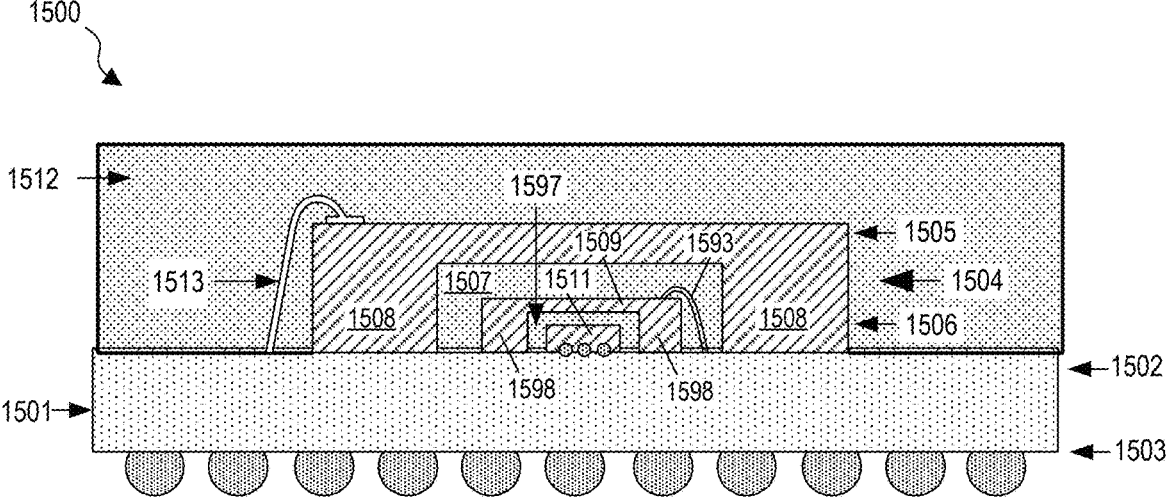

Further developing this theme, in FIG. 15 the semiconductor device assembly 1500 may contain a second inner semiconductor device 1511 nested within a second cut 1597 formed on the back surface of the first nested semiconductor device 1509. The second inner semiconductor device 1511 can be attached in a flip-chip arrangement by interconnects between pads on its active (e.g., lower) surface and pads on the upper surface 1502 of the substrate 1501.

The first inner semiconductor device 1509 can be attached in a wire-bonded arrangement by wirebonds 1593 between pads on its active (e.g., upper) surface and pads on the upper surface 1502 of the substrate 1501. Alternatively, the first inner device 1509 can be electrically connected to the substrate 1501 by other means (e.g., by a corresponding plurality of interconnects, such as solder balls, copper pillars, copper bumps, direct Cu-Cu cold welds, etc.). The second inner semiconductor device 1511 may be positioned in the center of its cut 1597, closer to one side, or off to one corner. The second inner semiconductor device 1511 can reach the up to the full height of the cut 1597 so that it touches the first inner device 1509, or the full width of the cut 1597 so that it is touching an uncut region 1598 (alternatively labeled 1698) in the back surface of the first inner device 1509.

Figure 16:
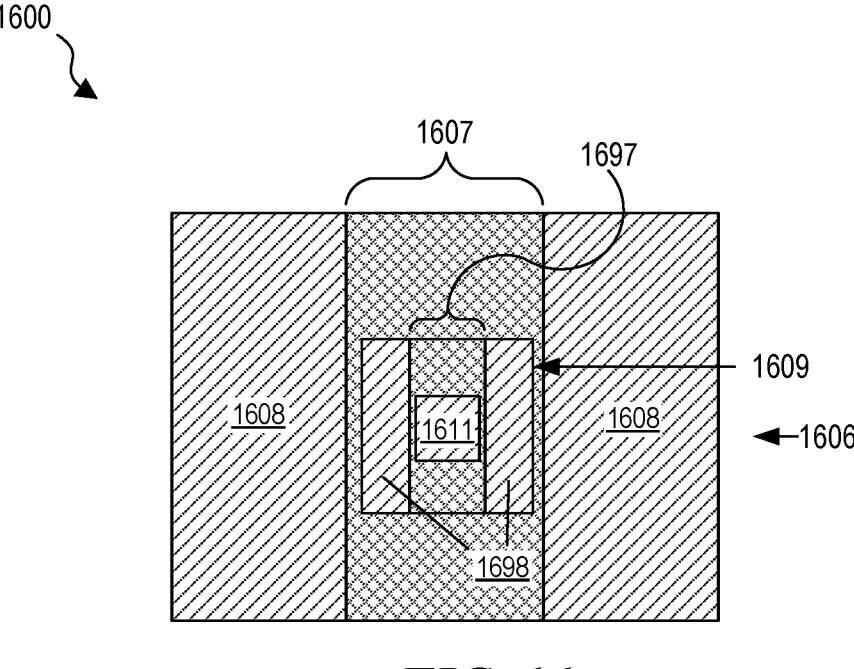
FIG. 16 is a simplified schematic plan view of a semiconductor device assembly in accordance with embodiments of the present technology.

Expanding upon the previously established embodiments, FIG. 16 depicts a simplified view of the back surface 1606 of the semiconductor device assembly 1600. This view shows how the first inner semiconductor device 1609 is disposed within the first cut 1607 in the back surface 1606 of the outer semiconductor device, and the second inner semiconductor device 1611 is disposed within the second cut 1697 of the first inner semiconductor device 1609. The first inner device 1609 may have more than one inner semiconductor device disposed within its cut 1697, at any point within the cut. Additionally, the cut 1697 can run the full length of the first inner device 1609, or reach only one edge of the back surface, or reach none of the edges of the back surface. Additionally, the cut 1697 can be represented by any shape, polygonal or circular, regular or irregular.

In accordance with one aspect of the present disclosure, the semiconductor devices illustrated in FIGS. 1-16 can be memory dies, such as dynamic random access memory (DRAM) dies, NOT-AND (NAND) memory dies, NOT-OR (NOR) memory dies, magnetic random access memory (MRAM) dies, phase change memory (PCM) dies, ferro-electric random access memory (FeRAM) dies, static random access memory (SRAM) dies, or the like. In an embodiment in which multiple dies are provided in a single assembly, the semiconductor devices can be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above can be logic dies (e.g., controller dies, processor dies, etc.), or a mix of logic and memory dies (e.g., a memory controller die and a memory die controlled thereby).

Any one of the semiconductor devices and semiconductor device assemblies described above with reference to FIGS. 1-16 can be incorporated into any of a myriad of larger and/or more complex systems, a representative example of which is system 1700 shown schematically in FIG. 17. The system 1700 can include a semiconductor device assembly (e.g., or a discrete semiconductor device) 1702, a power source 1104, a driver 1706, a processor 1708, and/or other subsystems or components 1710. The semiconductor device assembly 1702 can include features generally similar to those of the semiconductor devices described above with reference to FIGS. 1-16. The resulting system 1100 can perform any of a wide variety of functions, such as memory storage, data processing, and/or other suitable functions. Accordingly, representative systems 1700 can include, without limitation, hand-held devices (e.g., mobile phones, tablets, digital readers, and digital audio players), computers, vehicles, appliances and other products. Components of the system 1700 may be housed in a single unit or distributed over multiple, interconnected units (e.g., through a communications network). The components of the system 1700 can also include remote devices and any of a wide variety of computer readable media.

FIG. 18 is a flow chart illustrating a method of making a semiconductor device assembly. The method includes providing an outer semiconductor device having an active surface and a back surface (box 18210). The method further includes making a cut in the back surface of the outer semiconductor device, to a depth between the active surface and the back surface, and leaving an uncut region on opposing sides of the cut (box 1820). The method further includes disposing an inner semiconductor device within the cut (box 1830).

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
an outer semiconductor device, including:
an active surface, and
a back surface, the back surface including:
a cut extending to a depth between the active surface and the back surface, and uncut regions on opposing sides of the cut, and
a second cut extending to a second depth between the active surface and the back surface, and second uncut regions on opposing sides of the second cut, wherein the second cut intersects with a middle portion of the cut; and
an inner semiconductor device disposed at the middle portion of the cut.

2. The semiconductor device assembly of claim 1, wherein the cut has a width measured along an axis parallel to the back surface, and the inner semiconductor device has a width measured along the same axis, and the width of the cut is greater than the width of the inner semiconductor device.

3. The semiconductor device assembly of claim 1, wherein the depth of the cut is measured along an axis perpendicular to the back surface, and the inner semiconductor device has a height measured along the same axis, and the depth of the cut is greater than the height of the inner semiconductor device.

4. The semiconductor device assembly of claim 1, wherein the depth of the cut is measured along an axis perpendicular to the back surface, and the outer semiconductor device has a thickness measured along the same axis, and the depth of the cut is less than the thickness of the outer semiconductor device.

5. The semiconductor device assembly of claim 1, wherein: the cut is a first cut,
the outer semiconductor device has edges,
the first cut comprises an internal cavity such that the uncut regions surround the first cut and extend from the first cut to the edges of the outer semiconductor device, and
a second inner semiconductor device is disposed at the middle portion of the cut.

6. The semiconductor device assembly of claim 1, further comprising a substrate including:
an upper surface having a plurality of internal contact pads, and
a lower surface having a plurality of external contact pads,
wherein the uncut regions on the back surface of the outer semiconductor are attached to the upper surface of the substrate.

7. The semiconductor device assembly of claim 6, further comprising a stack of additional semiconductor devices disposed over the active surface of the outer semiconductor device.

8. The semiconductor device assembly of claim 6, wherein an encapsulant material at least partially encapsulates the outer semiconductor device and the substrate.

9. The semiconductor device assembly of claim 6, wherein:

the inner semiconductor device is a first inner semiconductor device;
the first inner semiconductor device includes:
a second active surface, and
a second back surface with second edges, the second back surface including a third cut extending to a third depth between the second active surface and the second back surface, and third uncut regions surrounding the third cut such that they extend from the third cut up to the edges of the second back surface, wherein the third uncut regions are attached to the upper surface of the substrate; and
a second inner semiconductor device is disposed within the third cut of the first inner semiconductor device.

10. A semiconductor device, comprising:
an outer semiconductor device having:
an active surface;
a back surface, the back surface including a cut extending to a depth between the active surface and the back surface, and uncut regions on opposing sides of the cut;
a first inner semiconductor device disposed within the cut, the first inner semiconductor device including:
a second active surface; and
a second back surface, including a second cut extending to a second depth between the second active surface and the second back surface, and second uncut regions surrounding the second cut; and
a second inner semiconductor device disposed within the second cut of the first inner semiconductor device.

11. The semiconductor device of claim 10, wherein the cut has a concave curved cross-sectional shape.

12. The semiconductor device of claim 10, wherein the cut has a polygonal cross-sectional shape.

13. The semiconductor device of claim 10, wherein the cut extends to an outer sidewall of the semiconductor device.

14. The semiconductor device of claim 10, wherein the cut extends to outer sidewalls on opposing sides of the semiconductor device.

15. The semiconductor device of claim 10, wherein:
the cut is a first cut; and
the back surface of the semiconductor device includes (i) a third cut extending to a third depth between the active surface and the back surface, and (ii) additional uncut regions on opposing sides of the third cut.

16. The semiconductor device of claim 15, wherein the first cut and the third cut are parallel.

17. A method of making a semiconductor device, the method comprising:
providing an outer semiconductor device including an active surface and a back surface;
providing an inner semiconductor device including a second active surface and a second back surface;
forming a cut in the back surface, wherein the cut extends to a depth between the active surface and the back surface, and wherein the back surface includes uncut regions on opposing sides of the cut;
forming a second cut in the second back surface, wherein the second cut extends to a second depth between the second active surface and the second back surface, and wherein the second back surface includes second uncut regions around the second cut; and
disposing the inner semiconductor device within the cut.

18. The method of claim 17, wherein the outer semiconductor device is one of a plurality of semiconductor devices in a wafer, wherein the plurality of semiconductor devices comprise a plurality of back surfaces, and wherein the cut comprises a plurality of cuts extending across the plurality of back surfaces of the plurality of semiconductor devices.

19. The method of claim 18, wherein the cut is formed with a saw, a laser, or with an etching operation.

\* \* \* \* \*